United States Patent
Soethoudt et al.

(10) Patent No.: US 11,187,998 B2
(45) Date of Patent: Nov. 30, 2021

(54) SUBSTRATE HOLDER, SUBSTRATE SUPPORT AND METHOD OF CLAMPING A SUBSTRATE TO A CLAMPING SYSTEM

(71) Applicant: ASML NETHERLANDS B.V., Veldhoven (NL)

(72) Inventors: Abraham Alexander Soethoudt, Eindhoven (NL); Thomas Poiesz, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 16/761,608

(22) PCT Filed: Oct. 24, 2018

(86) PCT No.: PCT/EP2018/079185
§ 371 (c)(1),
(2) Date: May 5, 2020

(87) PCT Pub. No.: WO2019/096554
PCT Pub. Date: May 23, 2019

(65) Prior Publication Data
US 2020/0326635 A1 Oct. 15, 2020

(30) Foreign Application Priority Data
Nov. 20, 2017 (EP) .................... 17202627

(51) Int. Cl.
*G03F 7/20* (2006.01)
*H01L 21/683* (2006.01)
(52) U.S. Cl.
CPC ...... *G03F 7/70716* (2013.01); *G03F 7/70708* (2013.01); *G03F 7/70783* (2013.01); *H01L 21/6831* (2013.01)

(58) Field of Classification Search
CPC .. G03F 7/707; G03F 7/70708; G03F 7/70716; G03F 7/70783; H01L 21/6875
See application file for complete search history.

(56) References Cited

U.S. PATENT DOCUMENTS 4,506,184 A 3/1985 Siddall
6,952,253 B2 10/2005 Lof et al.
(Continued)

FOREIGN PATENT DOCUMENTS

EP 1359466 11/2003
EP 1650604 4/2006
(Continued)

OTHER PUBLICATIONS

International Search Report and Written Opinion issued in corresponding PCT Patent Application No. PCT/EP2018/079185, dated Feb. 4, 2019.
(Continued)

*Primary Examiner* — Steven Whitesell Gordon
(74) *Attorney, Agent, or Firm* — Pillsbury Winthrop Shaw Pittman, LLP

(57) ABSTRACT

A substrate holder for use in a lithographic apparatus and configured to support a substrate, the substrate holder including a main body having a main body surface, a plurality of main burls projecting from the main body surface, wherein each main burl has a distal end surface configured to support the substrate, a first seal member projecting from the main body surface and having an upper surface, the first seal member surrounding the plurality of main burls and configured to restrict the passage of liquid between the substrate and the main body surface radially inward past the first seal member; and a plurality of minor burls projecting from the upper surface of the first seal
(Continued)

member, wherein each minor burl has a distal end surface configured to support the substrate.

20 Claims, 7 Drawing Sheets

(56) References Cited

U.S. PATENT DOCUMENTS

| | | | |
|---|---|---|---|
| 8,149,387 | B2 | 4/2012 | Alberti et al. |
| 10,192,772 | B2 | 1/2019 | Achanta et al. |
| 10,324,382 | B2 | 6/2019 | Kunnen et al. |
| 2001/0033369 | A1* | 10/2001 | Matsui ................ H01L 21/6875 355/53 |
| 2003/0176079 | A1 | 9/2003 | Sogard |
| 2004/0178362 | A1 | 9/2004 | Gilissen et al. |
| 2005/0219499 | A1 | 10/2005 | Zaal et al. |
| 2006/0102849 | A1* | 5/2006 | Mertens ............. G03F 7/70716 250/440.11 |
| 2008/0291411 | A1* | 11/2008 | Phillips .................. G03F 7/707 355/52 |
| 2010/0265488 | A1 | 10/2010 | Alberti et al. |
| 2012/0307216 | A1* | 12/2012 | Laurent .................. G03F 7/707 355/30 |
| 2013/0045447 | A1 | 2/2013 | Kunnen et al. |
| 2013/0164688 | A1 | 6/2013 | Cadee et al. |
| 2014/0368804 | A1 | 12/2014 | Donders et al. |
| 2015/0002832 | A1 | 1/2015 | Cadee et al. |
| 2015/0103325 | A1 | 4/2015 | Van Der Wilk et al. |
| 2015/0109599 | A1 | 4/2015 | Koevoets et al. |
| 2015/0348816 | A1 | 12/2015 | Stein |
| 2015/0349669 | A1 | 12/2015 | Baldus |
| 2015/0349670 | A1* | 12/2015 | Baldus ................ H01L 21/6875 361/234 |
| 2016/0187791 | A1 | 6/2016 | Houben et al. |
| 2017/0045828 | A1 | 2/2017 | Poiesz et al. |
| 2019/0043749 | A1 | 2/2019 | Baltis et al. |

FOREIGN PATENT DOCUMENTS

| | | |
|---|---|---|
| JP | 63-28035 A | 2/1988 |
| JP | 3-102850 A | 4/1991 |
| JP | 8-181054 A | 7/1996 |
| JP | 2006-128677 A | 5/2006 |
| JP | 2009-170874 A | 7/2009 |
| JP | 2013-042128 A | 2/2013 |
| JP | 2013-135218 A | 7/2013 |
| JP | 2014-183253 A | 9/2014 |
| JP | 2015-507367 A | 3/2015 |
| JP | 2017-515146 A | 6/2017 |
| TW | 200627079 | 8/2006 |
| TW | 201724350 A | 7/2017 |
| TW | 1623824 B | 5/2018 |
| WO | 99/49504 | 9/1999 |
| WO | 2016207122 | 12/2016 |

OTHER PUBLICATIONS

Office Action dated Apr. 20, 2021, issued in corresponding Japanese Patent Application No. 2020-527115 with English translation (11 pgs.).

English translation of Office Action dated Aug. 3, 2021, issued in corresponding Taiwan Patent Application No. 110105002 (3 pgs.).

* cited by examiner

SUBSTRATE HOLDER, SUBSTRATE SUPPORT AND METHOD OF CLAMPING A SUBSTRATE TO A CLAMPING SYSTEM

CROSS-REFERENCE TO RELATED APPLICATIONS

This application is the U.S. national phase entry of PCT Patent Application No. PCT/EP2018/079185, which was filed Oct. 24, 2018, which claims the benefit of priority of European patent application no. 17202627.0 which was filed on Nov. 20, 2017 and which is incorporated herein in its entirety by reference.

FIELD

The present invention relates to a method of clamping a substrate to a clamping system, to a substrate holder for use in a lithographic apparatus and configured to support a substrate on a substrate support, as well as to a substrate support.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In a lithographic apparatus a substrate is held on a substrate holder. It is desirable that the substrate is as flat as possible to minimise imaging errors that could be incorporated due to any deviation from perfect flatness. One difficulty is that when the substrate is initially placed onto the substrate holder the substrate may be non-flat. Once on the substrate holder, the substrate has in-plane stresses in it and burls of the substrate holder which support the substrate are elastically deformed. These in-plane shear stresses in the substrate result in in-plane deformations in the substrate which themselves result in overlay errors.

SUMMARY

It is an object of the present invention to provide a method, substrate holder and substrate support incorporating a substrate holder in which measures are taken to encourage a substrate placed on the substrate holder to relax.

In an embodiment of the present invention there is provided a method of clamping a substrate to a clamping system, the method comprising the steps of: providing a substrate holder comprising; a main body having a first main body surface and a second main body surface, wherein the first main body surface and second main body surface are on opposite sides of the main body; and a plurality of first burls projecting from the first main body surface, wherein each first burl has a distal end surface configured to support the substrate; providing a support surface for supporting the substrate holder; providing a plurality of second burls for supporting the substrate holder on the support surface through contact with distal end surfaces of the plurality of second burls: generating a first force to attract the substrate holder to the support surface; placing the substrate on the substrate holder such that it contacts the plurality of first burls; generating a second force to attract the substrate to the substrate holder; and controlling at least one of the first force and the second force in a release step to deform the main body between the second burls such as to create a gap between the distal end surfaces of a first subset of the plurality of first burls and the substrate and such that the substrate is supported on distal end surfaces of a second subset of the plurality of first burls.

In an embodiment of the present invention, there is provided a substrate holder for use in a lithographic apparatus and configured to support a substrate on a substrate support, the substrate holder comprising: a main body having a first main body surface and a second main body surface, wherein the first main body surface and the second main body surface are on opposite sides of the main body; a plurality of first burls projecting from the first main body surface, wherein each first burl has a distal end surface configured to support the substrate; and a plurality of second burls projecting from the second main body surface, wherein each second burl has a distal end surface for supporting the substrate holder on the substrate support wherein the distal end surfaces of a first subset of the plurality of first burls are a first distance from the first main body surface and the distal end surfaces of a second subset of the plurality of first burls are a second distance from the first main body surface, the first distance is more than the second distance.

In an embodiment of the present invention, there is provided a substrate support comprising: a substrate holder comprising: a main body having a first main body surface and a second main body surface, wherein the first main body surface and second main body surface are on opposite sides of the main body; and a plurality of first burls projecting from the first main body surface, wherein each first burl has a distal end surface configured to support the substrate; and a support surface for supporting the substrate holder through contact with distal end surfaces of a plurality of second burls projecting from the support surface; wherein the distal end surfaces of a first subset of the plurality of first burls are a first distance from the first main body surface and the distal end surfaces of a second subset of the plurality of first burls are a second distance from the first main body surface, the first distance is more than the second distance.

In an embodiment of the present invention, there is provided a substrate holder for use in a lithographic apparatus and configured to support a substrate on a substrate support, the substrate holder comprising: a main body having a first main body surface and a second main body surface, wherein the first main body surface and the second main body surface are on opposite sides of the main body;

a plurality of first burls projecting from the first main body surface, wherein each first burl has a distal end surface configured to support the substrate; a plurality of electrodes to which voltages may be applied in order to secure the substrate holder to the substrate support; wherein the plurality of electrodes are configured such that depending on the voltage applied, a force between portions of the main body of the substrate holder underneath a first subset of the plurality of first burls and the substrate support is controllable independently of a force between portions of the main body of the substrate holder underneath a second subset of the plurality of first burls and the substrate support.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
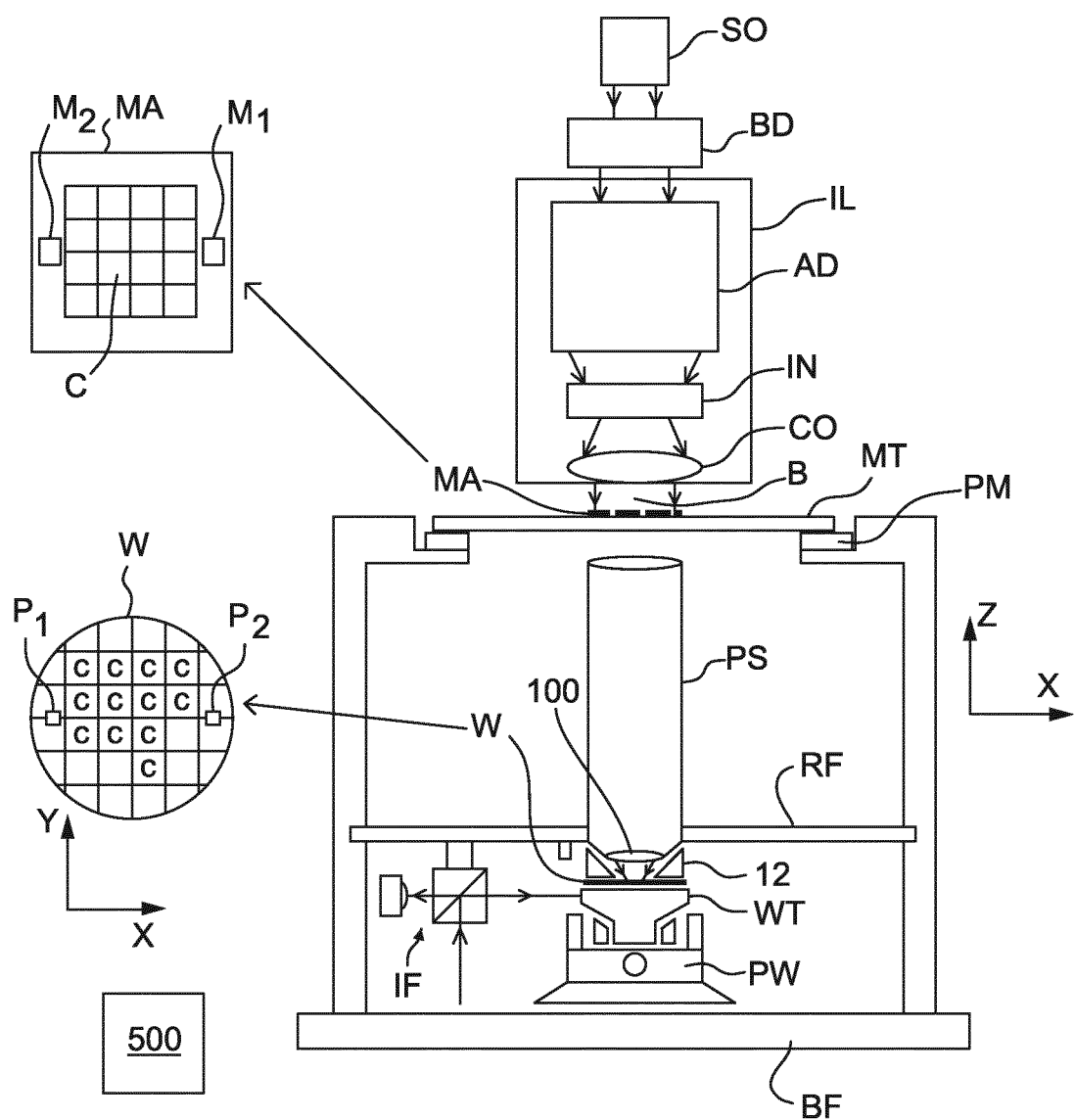
FIG. 1 depicts a schematic overview of a lithographic apparatus.

FIG. 1 schematically depicts a lithographic apparatus. The lithographic apparatus includes an illumination system (also referred to as illuminator) IL configured to condition a radiation beam B (e.g., UV radiation or DUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a substrate table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate may be covered by an immersion liquid having a relatively high refractive index, e.g., water, so as to fill a space 11 between the projection system PS and the substrate W—which is also referred to as immersion lithography. More information on immersion techniques is given in U.S. Pat. No. 6,952,253, which is incorporated herein by reference.

The lithographic apparatus may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Immersion techniques have been introduced into lithographic systems to enable improved resolution of smaller features. In an immersion lithographic apparatus, a liquid layer of immersion liquid having a relatively high refractive index is interposed in a space 11 between a projection system PS of the apparatus (through which the patterned beam is projected towards the substrate W) and the substrate W. The immersion liquid covers at least the part of the substrate W under a final element of the projection system PS. Thus, at least the portion of the substrate W undergoing exposure is immersed in the immersion liquid. The effect of the immersion liquid is to enable imaging of smaller features since the exposure radiation will have a shorter wavelength in the liquid than gas. (The effect of the immersion liquid may also be regarded as increasing the effective numerical aperture (NA) of the system and also increasing the depth of focus.)

In commercial immersion lithography, the immersion liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the immersion space 11 as immersion liquid. Other liquids with a high refractive index can be used besides water can be used as the immersion liquid, for example: a hydrocarbon, such as a fluorohydrocarbon; and/or an aqueous solution. Further, other fluids besides liquid have been envisaged for use in immersion lithography.

In this specification, reference will be made in the description to localized immersion in which the immersion liquid is confined, in use, to the space 11 between the final element 100 and a surface facing the final element 100. The facing surface is a surface of substrate W or a surface of the supporting stage (or substrate support WT) that is co-planar with the surface of the substrate W. (Please note that reference in the following text to surface of the substrate W also refers in addition or in the alternative to the surface of the substrate support WT, unless expressly stated otherwise; and vice versa). A fluid handling structure 12 present between the projection system PS and the substrate support WT is used to confine the immersion liquid to the immersion space 11. The space 11 filled by the immersion liquid is smaller in plan than the top surface of the substrate W and the space 11 remains substantially stationary relative to the projection system PS while the substrate W and substrate support WT move underneath.

Other immersion systems have been envisaged such as an unconfined immersion system (a so-called 'All Wet' immersion system) and a bath immersion system. In an unconfined immersion system, the immersion liquid covers more than the surface under the final element 100. The liquid outside the immersion space 11 is present as a thin liquid film. The liquid may cover the whole surface of the substrate W or even the substrate W and the substrate support WT co-planar with the substrate W. In a bath type system, the substrate W is fully immersed in a bath of immersion liquid.

The fluid handling structure 12 is a structure which supplies the immersion liquid to the immersion space 11, removes the immersion liquid from the space 11 and thereby confines the immersion liquid to the immersion space 11. It includes features which are a part of a fluid supply system. The arrangement disclosed in PCT patent application publication no. WO 99/49504 is an early fluid handling structure comprising pipes which either supply or recover the immersion liquid from the space 11 and which operate depending on the relative motion of the stage beneath the projection system PS. In more recent designs, the fluid handling structure extends along at least a part of a boundary of the space 11 between the final element 100 of the projection system PS and the substrate support WT or substrate W, so as to in part define the space 11.

The fluid handling structure 12 may have a selection of different functions. Each function may be derived from a corresponding feature that enables the fluid handling structure 12 to achieve that function. The fluid handling structure 12 may be referred to by a number of different terms, each referring to a function, such as barrier member, seal member, fluid supply system fluid removal system, liquid confinement structure, etc.

As a barrier member, the fluid handling structure 12 is a barrier to the flow of the immersion liquid from the space 11. As a liquid confinement structure, the structure confines the immersion liquid to the space 11. As a seal member, sealing features of the fluid handling structure form a seal to confine the immersion liquid to the space 11. The sealing features may include an additional gas flow from an opening in the surface of the seal member, such as a gas knife.

In an embodiment the fluid handling structure 12 may supply immersion fluid and therefore be a fluid supply system.

In an embodiment the fluid handling structure 12 may at least partly confine immersion fluid and thereby be a fluid confinement system.

In an embodiment the fluid handling structure 12 may provide a barrier to immersion fluid and thereby be a barrier member, such as a fluid confinement structure.

In an embodiment the fluid handling structure 12 may create or use a flow of gas, for example to help in controlling the flow and/or the position of the immersion fluid.

The flow of gas may form a seal to confine the immersion fluid so the fluid handling structure 12 may be referred to as a seal member; such a seal member may be a fluid confinement structure.

In an embodiment, immersion liquid is used as the immersion fluid. In that case the fluid handling structure 12 may be a liquid handling system. In reference to the aforementioned description, reference in this paragraph to a feature defined with respect to fluid may be understood to include a feature defined with respect to liquid.

A lithographic apparatus has a projection system PS. During exposure of a substrate W, the projection system PS projects a beam of patterned radiation onto the substrate W. To reach the substrate W, the path of the radiation beam B passes from the projection system PS through the immersion liquid confined by the fluid handling structure 12 between the projection system PS and the substrate W. The projection system PS has a lens element, the last in the path of the beam, which is in contact with the immersion liquid. This lens element which is in contact with the immersion liquid may be referred to as 'the last lens element' or "the final element". The final element 100 is at least partly surrounded by the fluid handling structure 12. The fluid handling structure 12 may confine the immersion liquid under the final element 100 and above the facing surface.

Figure 2A:
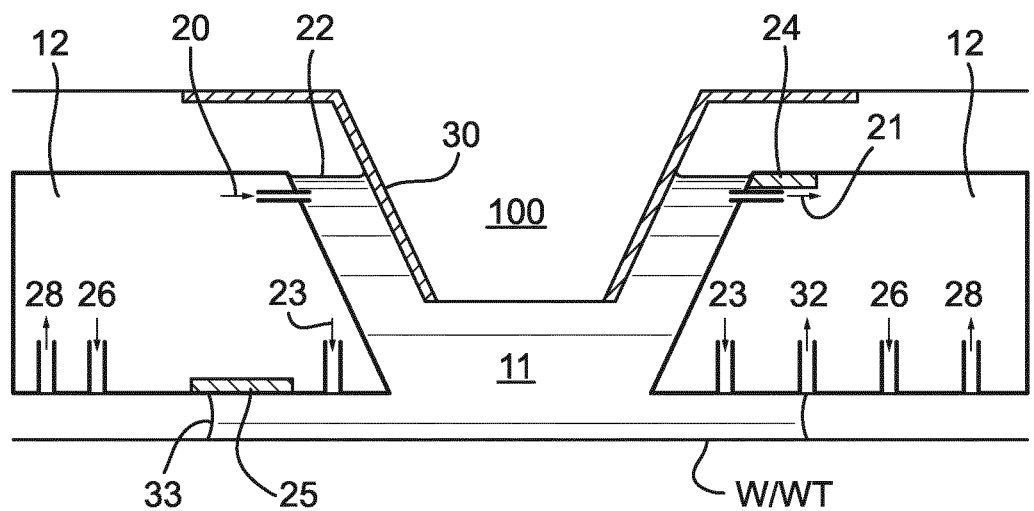
FIGS. 2a and 2b depict, in cross section, two different versions of a fluid handling structure with different features illustrated on the left hand side and the right hand side, which may extend around the complete circumference.
Figure 2B:
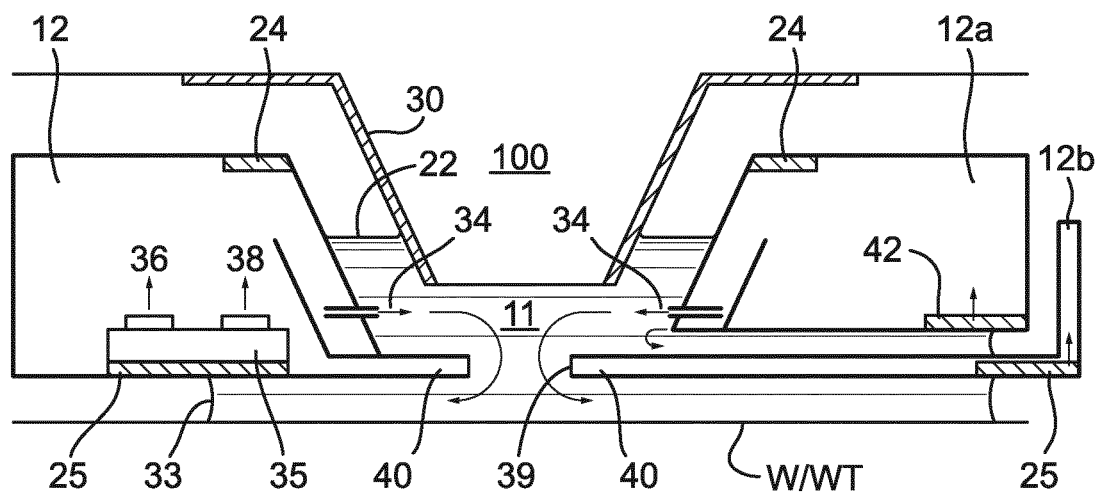

FIGS. 2a and 2b show different features which may be present in variations of fluid handling structure 12. The designs may share some of the same features as FIGS. 2a and 2b unless described differently. The features described herein may be selected individually or in combination as shown or as required.

FIG. 2a shows a fluid handling structure 12 around the bottom surface of a final element 100. The final element 100 has an inverted frusto-conical shape. The frusto-conical shape having a planar bottom surface and a conical surface. The frusto-conical shape protrudes from a planar surface and having a bottom planar surface. The bottom planar surface is the optically active portion of the bottom surface of the final element 100, through which the radiation beam B may pass. The final element 100 may have a coating 30. The fluid handling structure 12 surrounds at least part of the frusto-conical shape. The fluid handling structure 12 has an inner-surface which faces towards the conical surface of the frusto-conical shape. The inner-surface and the conical surface have complementary shape. A top surface of the fluid handling structure 12 is substantially planar. The fluid handling structure 12 may fit around the frusto-conical shape of the final element 100. A bottom surface of the fluid handling structure 12 is substantially planar and in use the bottom surface may be parallel with the facing surface of the substrate support WT and/or substrate W. The distance between the bottom surface and the facing surface may be in the range of 30 to 500 micrometers, desirably in the range of 80 to 200 micrometers.

The fluid handling structure 12 extends closer to the facing surface of the substrate W and substrate support WT than the final element 100. A space 11 is therefore defined between the inner surface of the fluid handling structure 12, the planar surface of the frusto-conical portion and the facing surface. During use, the space 11 is filled with immersion liquid. The immersion liquid fills at least part of a buffer space between the complementary surfaces between the final element 100 and the fluid handling structure 12, in an embodiment at least part of the space between the complementary inner-surface and the conical surface.

The immersion liquid is supplied to the space 11 through an opening formed in a surface of the fluid handling structure 12. The immersion liquid may be supplied through a supply opening 20 in the inner-surface of the fluid handling structure 12. Alternatively or additionally, the immersion liquid is supplied from an under supply opening 23 formed in the undersurface of the fluid handling structure 12. The under supply opening 23 may surround the path of the radiation beam B and it may be formed of a series of openings in an array. The immersion liquid is supplied to fill the space 11 so that flow through the space 11 under the projection system PS is laminar. The supply of the immersion liquid from the opening 23 under the fluid handling structure 12 additionally prevents the ingress of bubbles into the space 11. This supply of the immersion liquid functions as a liquid seal.

The immersion liquid may be recovered from a recovery opening 21 formed in the inner-surface. The recovery of the immersion liquid through the recovery opening 21 may be by application of an under pressure; the recovery through the recovery opening 21 as a consequence of the velocity of the immersion liquid flow through the space 11; or the recovery may be as a consequence of both. The recovery opening 21 may be located on the opposite side of the supply opening 20, when viewed in plan. Additionally or alternatively, the immersion liquid may be recovered through an overflow opening 24 located on the top surface of the fluid handling structure 12. In an embodiment, the supply and recovery openings 20, 21 can have their function swapped (i.e. the flow direction of liquid is reversed). This allows the direction of flow to be changed depending upon the relative motion of the fluid handling structure 12 and substrate W.

Additionally or alternatively, immersion liquid may be recovered from under the fluid handling structure 12 through a recovery opening 25 formed in its bottom surface. The recovery opening 25 may serve to hold (or 'pin') a meniscus 33 of the immersion liquid to the fluid handling structure 12. The meniscus 33 forms between the fluid handling structure 12 and the facing surface and it serves as border between the liquid space and the gaseous external environment. The recovery opening 25 may be a porous plate which may recover the immersion liquid in a single phase flow. The recovery opening in the bottom surface may be a series of pining openings 32 through which the immersion liquid is recovered. The pining openings 32 may recover the immersion liquid in a two phase flow.

Optionally radially outward, with respect to the inner-surface of the fluid handling structure 12, is an gas knife opening 26. Gas may be supplied through the gas knife opening 26 at elevated speed to assist liquid confinement of the immersion liquid in the space 11. The supplied gas may be humidified and it may contain substantially carbon dioxide. Radially outward of the gas knife opening 26 is a gas recovery opening 28 for recovering the gas supplied through the gas knife opening 26. Further openings, for example open to atmosphere or to a gas source, may be present in the bottom surface of the fluid handling structure 12. For example, further openings may be present between gas knife opening 26 and gas recovery opening 28 and/or between pining openings 32 and gas knife opening 26.

Features shown in FIG. 2b which are common to FIG. 2a share the same reference numbers. The fluid handling structure 12 has an inner surface which complements the conical surface of the frusto-conical shape. The undersurface of the fluid handling structure 12 is closer to the facing surface than the bottom planar surface of the frusto-conical shape.

Immersion liquid is supplied to the space 11 through supply openings 34 formed in the inner surface of the fluid handling structure 12. The supply openings 34 are located towards the bottom of the inner surface, perhaps below the bottom surface of the frusto-conical shape. The supply openings 34 are located around the inner surface, spaced apart around the path of the radiation beam B.

Immersion liquid is recovered from the space 11 through recovery openings 25 in the undersurface of the fluid handling structure 12. As the facing surface moves under the fluid handling structure 12, the meniscus 33 may migrate over the surface of the recovery opening 25 in the same direction as the movement of the facing surface. The recovery openings 25 may be formed of a porous member. The immersion liquid may be recovered in single phase. In an embodiment the immersion liquid is recovered in a two phase flow. The two phase flow is received in a chamber 35 within the fluid handling structure 12 where it is separated into liquid and gas. The liquid and gas are recovered through separate channels 36, 38 from the chamber 35.

An inner periphery 39 of the undersurface of fluid handling structure 12 extends into the space 11 away from the inner surface to form a plate 40. The inner periphery 39 forms a small aperture which may be sized to match the shape and size of the radiation beam B. The plate 40 may serve to isolate the immersion liquid at either side of it. The supplied immersion liquid flows inwards towards the aperture, through the inner aperture and then under the plate 40 radially outwardly towards the surrounding the recovery openings 25.

In an embodiment the fluid handling structure 12 may be in two parts as shown on the right hand side of FIG. 2b: an inner part 12a and an outer part 12b. The inner part 12a and the outer part 12b may move relatively to each other, in a plane parallel to facing surface. The inner part 12a may have the supply openings 34 and it may have the overflow recovery 24. The outer part 12b may have the plate 40 and the recovery opening 25. The inner part 12a may have an intermediate recovery 42 for recovering the immersion liquid which flows between the inner part 12a and the outer part 12b.

The present invention will be described below with reference to an immersion lithographic apparatus. In such an apparatus imaging of the substrate W is performed with most parts of the apparatus surrounded by a gaseous atmosphere. A substrate support WT, as described below, in such an apparatus can make the use of one or more underpressures in order to apply a force to the substrate W to hold it in place. However, the present invention is applicable to other types of lithographic apparatus. For instance, the invention is suitable for use in any apparatus where imagining of the substrate W is carried out in a gaseous atmosphere. Additionally the invention can be applied to an EUV lithographic apparatus in which imaging of the substrate W is carried out in a vacuum. In that instance, instead of using underpressures to generate a holding force on the substrate W, electrostatic forces are used to hold the substrate W in place. This will be described with reference to FIGS. 9, 10 and 11.

Figure 3:
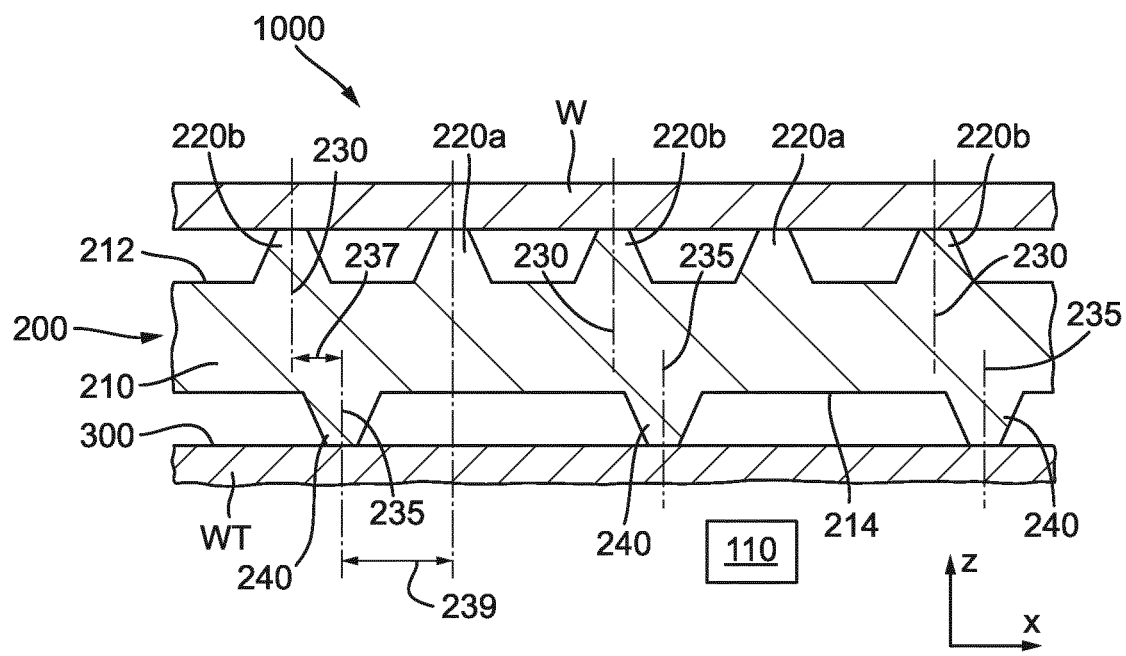
FIG. 3 illustrates, in cross-section, a substrate holder, substrate and substrate support of an embodiment.

The substrate support WT comprises a substrate holder 200 which is configured to support the substrate W. FIG. 3 illustrates, in cross-section a substrate holder 200 and the associated substrate W and a substrate support WT according to an embodiment. FIG. 3 illustrates the situation in which the substrate W is clamped ready for imaging. The substrate holder 200 comprises a main body 210 having a first main body surface 212. In use the first main body surface 212 faces an undersurface of the substrate W.

In a central region of the first main body surface 212, a plurality of first burls 220 project from the first main body surface 212. Each first burl 220 has a distal end surface configured to support the substrate W. The first burls 220 are arranged relative to another in a first regular pattern, in plan. The first regular pattern is such as to support the substrate W and to reduce any bowing of the substrate W towards or away from the main body surface 212 to an acceptable amount.

The area in plan of each first burl 220 is relatively small compared to the area, in plan, of the substrate W. Therefore the first burls 220 contact only a small area of the undersurface of the substrate W. This reduces the opportunity for contamination to be transferred from the substrate holder 200 to the substrate W.

The main body 210 has a second main body surface 214. The second main body surface 214 is on an opposite side of the main body 210 to the first main body surface 212. In use the second main body surface 214 faces a support surface 300 of the substrate support WT.

In a central region of the second main body surface 214 a plurality of second burls 240 project from the second main body surface 214. Each second burl 240 has a distal end surface configured to support the substrate holder 200 on the support surface 300 of the substrate support WT through contact with the support surface 300. The second burls 240 are arranged relative to another in a second regular pattern, in plan. The second regular pattern is such as to support the substrate holder 200.

The substrate holder 200 and substrate support WT together make up a clamping system 1000. The clamping system 1000 is adapted to be able to extract gas from between the first main body surface 212 and the substrate W as well as from between the second main body surface 214 and the support surface 300 under the control of a clamping system controller 110. The clamping system controller 110 is configured to control the pressure of gas between the first main body surface 212 and substrate W independently of the pressure of gas between the second main body surface 214 and the support surface 300.

Similarly a pressure differential across the substrate holder 200 may be established. For example, the space between the main body 210 of the substrate holder 200 and the support surface 300 of the substrate support WT is evacuated to an underpressure that is lower than a higher pressure above the substrate W. The pressure difference gives rise to a first force holding the substrate holder 200 to the substrate support WT.

A pressure differential across the substrate W is established. For example, the space between the main body 210 of the substrate holder 200 and the substrate W is evacuated to an under pressure that is lower than a higher pressure above the substrate W. The pressure difference gives rise to a second force holding the substrate W to the substrate holder 200.

The precise arrangement of first burls 220 and second burls 240 will be described below. However it will be apparent from FIG. 3 that in an embodiment the number of second burls 240 is less than the number of first burls 220. The first burls 220 are split into two or more subsets. For simplicity the present invention is described in relation to having a first subset 220a of the plurality of first burls 220 and a second subset 220b of the plurality of first burls 220. However the invention can be extended to having further subsets of the plurality of first burls 220.

The substrate holder 200 is arranged such that the first subset 220a of the plurality of first burls 220 are moveable in the z direction towards and away from the substrate W relative to the second subset 220b of the plurality of first burls 220. Two general ways of achieving this will be described. The first way is that illustrated in FIGS. 3 and 4 which uses underpressures to generate a force between the substrate holder 200 and the substrate support WT and between the substrate holder 200 and the substrate W. The second way is illustrated with reference to FIGS. 8, 9, and 10 where electrodes are used to generate electrostatic forces between the substrate holder 200 and substrate support WT and between the substrate holder 200 and the substrate W. Hybrid systems which use one or both underpressure and electrostatic forces are also possible.

In the embodiment of FIG. 3, the second subset 220b of the plurality of first burls 220 each has an axis 230 which is a distance 237 from an axis 235 of one of the plurality of second burls 240 which is smaller than the distance 239 between an axis of a burl of the first subset 220a of the plurality of first burls 220 and the closest axis 235 of one of the plurality of second burls 240. In other words, each burl of the second subset 220b of the plurality of first burls 220 has a corresponding second burl 240. In an embodiment, such as for example illustrated in FIG. 3 if the distance 237 were zero, a central axis 235 of each second burl 240 is coaxial with a central axis 230 of a corresponding one of the first burls 220. The alignment of the second subset 220b of the plurality of first burls 220 with second burls 240 means that force from the substrate W on the substrate holder 200 is transferred down to the substrate support WT through both the burls of the second subset 220b and the second burls 240. In other words the stiffness of the substrate holder 200 at a position corresponding to positions of each of the burls of the second subset 220b of the plurality of first burls 220 is greater than a stiffness of the substrate holder 200 at a position corresponding to positions of each of the burls of the first subset 220a of the plurality of first burls 220. The axes 235 and 230 could be co-planar. Other ways of achieving this difference in stiffness are possible, for example by varying the thickness of the main body 210 and/or varying the dimensions of second burls 240 (smaller second burls 240 providing lower stiffness).

In an embodiment, the number of burls of the second subset 220b is substantially equal to the number of the plurality of second burls 240.

Figure 4:
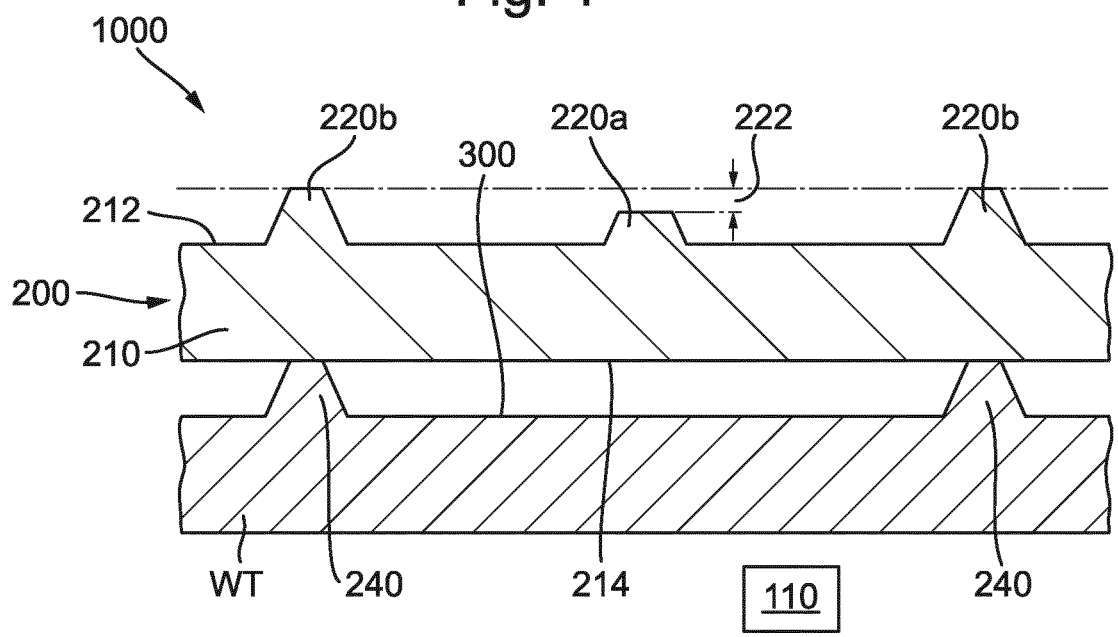
FIG. 4 illustrates an alternative embodiment of substrate holder and substrate support, in a relaxed state.

The embodiment of FIG. 4 is the same as the embodiment of FIG. 3 except as described below. In the embodiment of FIG. 4, the second burls 240 are part of the substrate support WT and project from the support surface 300. The substrate holder 200 and substrate support WT of the FIG. 4 embodiment works in the same way as that of the embodiment of FIG. 3. The embodiment of FIG. 3 could also have the second burls 240 projecting from the support surface 300 rather than from the second main body surface 214.

As illustrated in FIG. 4, the substrate holder 200 is in a relaxed state in which no forces are being applied to it. The substrate holder 200 of the embodiment of FIG. 3 is similar, in the relaxed state. In this configuration the distance which the distal ends of the burls of the first subset 220a project from the first main body surface 212 is less than the corresponding distance which the burls of the second subset 220b project from the first main body surface 212. The difference in distance is illustrated by gap 222 illustrated in FIG. 4. The reason for this is the above mentioned property that the stiffness of the substrate holder 200 at a position corresponding to the burls of the first subset 220a is lower than at positions corresponding to burls of the second subset 220b. Therefore if the same force is applied attracting the substrate W to the substrate holder 200 over the entire area, the main body 210 will bow at positions corresponding to the first subset of burls 220a towards the substrate W. If the burls of the first subset 220a and the second subset 220b were the same distance from the first main body surface 212, this would result in the burls of the first subset 220a standing proud of the burls of the second subset 220b. In order to make sure that when the substrate W is clamped in position ready for imaging that the distal end surfaces of all of the first burls 220 are in the same plane, the distance which the distal end surfaces of the burls of the first subset 220a project from the first main body surface 212 is less by an amount illustrated by gap 222 than the distance which the distal end surfaces of the burls of the second subset 220b project from the first main body surface 212. As a result, in the clamped state, the substrate W can be held flat and in contact with all of the first burls 220 as illustrated in FIG. 3. In the situation illustrated in FIG. 7 and as described below, the bowing of the main body 210 at a position corresponding to a burl of the first subset 220a is illustrated schematically whereas in FIG. 3 this bowing is not illustrated.

Figure 6:
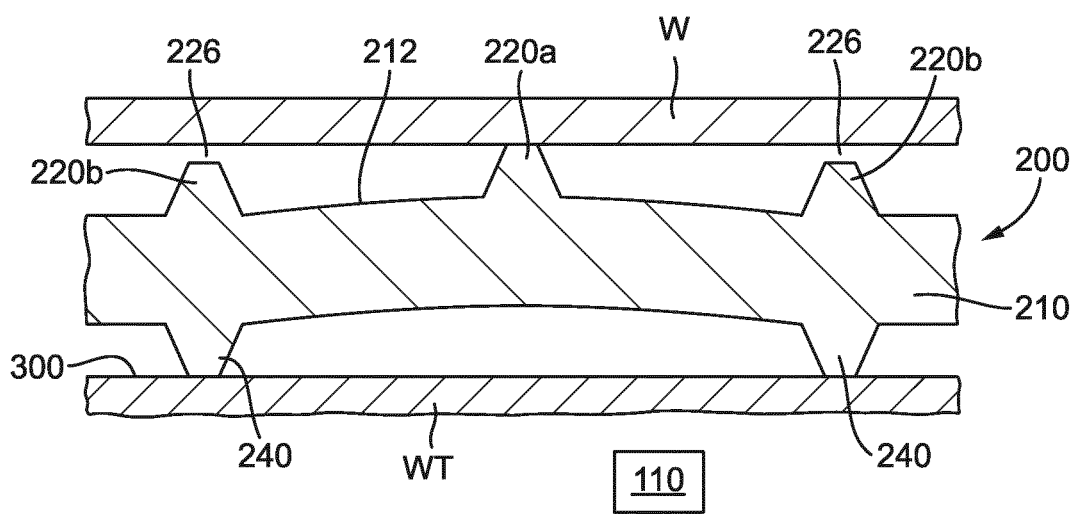
Figure 7:
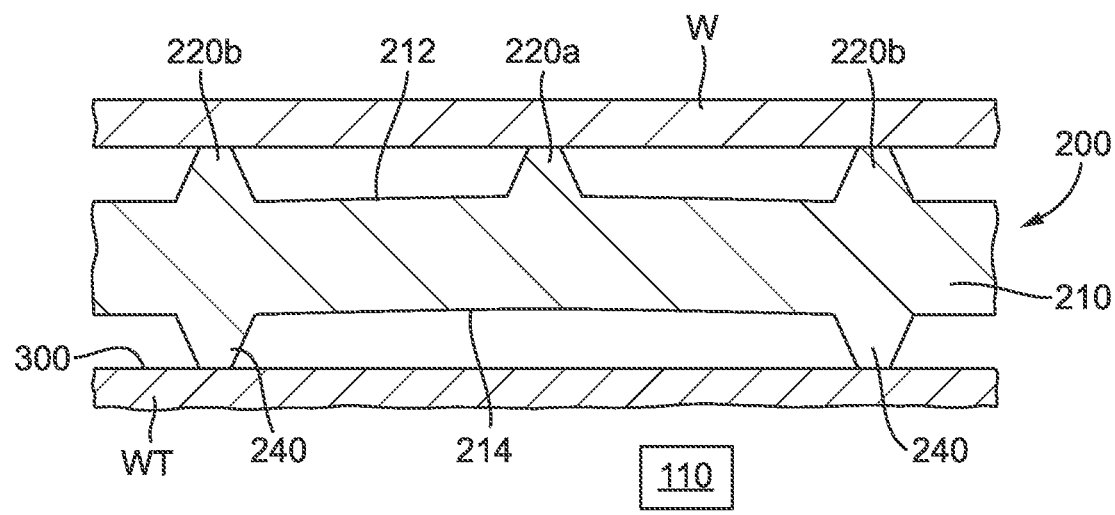

If a lower pressure is applied between the main body 210 and the substrate support WT than between the main body 210 and the substrate W, deformation of the main body 210 towards the substrate support WT may occur between the second burls 240. As a result burls of the first subset 220a will move slightly downwards towards the substrate support WT and away from the substrate W. This allows the substrate W to be supported in this condition by fewer first burls 220, namely by burls of the second subset 220b, than would be the case either if the pressure above and below, as illustrated in FIG. 3, the main body 210 were equal or if each of the first burls 220 had a corresponding second burl 240. This principle is used in the invention relating to a method of clamping a substrate, as discussed below with reference to FIGS. 5-7. First the substrate W is loaded onto the substrate support 200 in a way such as illustrated in FIG. 3. The substrate W may initially be bowed (up (umbrella) or down (bowl)). In this configuration because of the high friction between the distal end surfaces of the first burls 220 and the substrate W, elastic deformation of the first burls 220 in the xy plane is present. This elastic deformation results in in-plane deformation of the substrate W. By continuing to hold the substrate W but releasing one subset of the two subsets 220a, 220b of the plurality of first burls 220, any elastic deformation of the burls of the released subset 220a, 220b can relax. The burls of the released subset of burls can then be re-engaged with the substrate W. In the particular configuration illustrated in FIGS. 3-7 it is then possible to release the other subset 220a, 220b of burls from contact with the substrate W such that they can also relax. This process may be repeated as many times as is desirable, each iteration resulting in lower in-plane stress in the substrate W. Finally the substrate W may be fully clamped ready for imaging by engaging the distal end surfaces of all of the first burls 220 with the substrate W, as illustrated in FIG. 7.

FIGS. 3 and 5 to 7 show how the clamping system 1000 can be used during loading of the substrate W on the substrate holder 200 and to enable the substrate W to relax more fully than would be the case if the main body 210 does not bow between the second burls 240. The same principles can be applied to the clamping system of FIG. 4.

An underpressure is generated between the main body 210 and the support surface 300 to generate a first force to attract the substrate holder 200 to the support surface 300. A second force is generated to attract the substrate W to the substrate holder 200 by generating an underpressure between the substrate W and the substrate holder 200. The substrate W is then loaded onto the substrate holder 200 as illustrated in FIG. 3.

Figure 5:
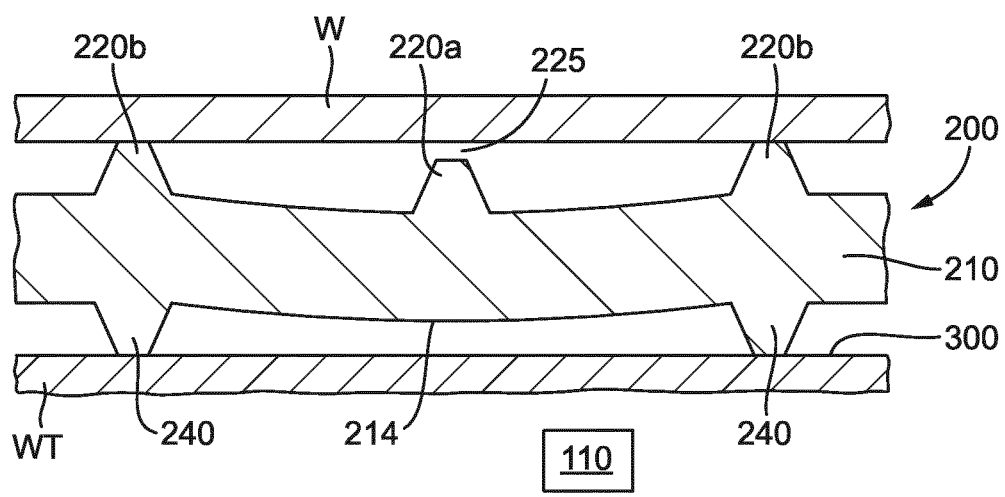
FIGS. 5-7 illustrate the steps of placing a substrate onto the substrate holder supported by the substrate support of FIG. 3 or 4.

The magnitudes of the first and second force are controlled to result in a release step in which the main body 210 moves towards the support surface 300 in areas under burls of the first subset 220a (the central first burl 220a as illustrated in FIG. 5) to create a gap 225 between distal end surfaces of burls of the first subset 220a and the substrate W. The absence of second burls 240 below burls of the first subset 220a means that the relatively thin main body 210 will deform between the matching sets of burls of the second subset 220b and second burls 240 when force with which the substrate holder 200 is attracted to the substrate support WT is increased. The deformation of the main body 210 is downwards towards the substrate support WT away from the substrate W. As a result the distal end surface of the burls of the first subset 220a positioned above the less stiff portion of the main body 210 which deforms towards the substrate support WT moves out of contact with the undersurface of the substrate W. This means that it is possible to support the substrate W on the substrate holder 200 in a condition in which not all of the first burls 220 are in contact with the undersurface of the substrate W.

As a result of the burls of the first subset 220a coming out of contact with the substrate W, in plane stresses in the burls of the first subset 220a are relaxed. Similarly, any in-plane stresses in the substrate W resulting from contact between the burls of the first subset 220a and the substrate W are relaxed in the substrate W. Thereby in-plane deformations of the substrate W are reduced resulting in better overlay performance.

After the substrate W has released, as illustrated in FIG. 5, the burls of the first subset 220a which do not have a corresponding second burl 240 are still distal from the undersurface of the substrate W. That is, a gap 225 exists between the distal end surface of the burls of the first subset 220a and the undersurface of the substrate W.

At this stage, the controller 110 begins a re-engagement step by increasing the underpressure (i.e. reduces absolute pressure) between the first main body surface 212 and the substrate W. This is effective to increase the second force to attract the substrate W to the substrate holder 200 as the pressure under the substrate W is lower than the pressure above the substrate W. Alternatively or additionally the underpressure between the second main body surface 214 and the support surface 300 may be decreased (i.e. increases the absolute pressure) thereby to decrease the first force. Both the first and second force may be varied. Thus the situation moves to a situation in which all of the first burls 220 contact the undersurface of the substrate W.

In a disengagement step the underpressure between the first main body surface 212 and the substrate W is increased and/or the underpressure between the second main body surface 214 and the support surface 300 is decreased. That is in the disengagement step the first force is reduced and/or the second force is increased. This results in a gap 226 developing between the distal end surfaces of the burls of the second subset 220b and the substrate W. This is due to the main body 210 bowing away from the support surface 300 at locations corresponding to the burls of the first subset 220a as a result of the change in the first and/or second force. That is, the substrate W is then only support by burls of the first subset 220a, as illustrated in FIG. 6. In this position any in-plane elastic deformations of the burls of the second subset 220b can relax and any associated in-plane stresses in the substrate W at the positions of the burls of the second subset 220b and also relax.

The final stage, namely a further re-engagement step, is illustrated in FIG. 7. Here a step of controlling the first and/or second force such that the of the burls of the first subsets 220a and the second subset 220b contact the substrate W and hold it flat ready for imagining is performed.

For instance, the pressure between the main body 210 and the support surface 300 is the same as the pressure between the main body 210 and the substrate W. During the further re-engagement step, the first force is increased and/or the second force is reduced. As a result, because of the lower stiffness of the main body 210 at a position of burls of the first subset 220a, the main body 210 deforms towards the substrate W between the second burls 240. Due to the difference in height, i.e., the gap 222 in the relaxed state of the substrate holder 200 between burls of the first subset 220a and the second subset 220b, the bowing results in the distal end surfaces of burls of both the first subset 220a and the second subset 220b ending up in substantially the same plane such that the substrate W can be held flat whilst being in contact with all of the first burls 220. In this way in-plane stresses in the substrate W are relaxed. Therefore in the position illustrated in FIG. 7 all of the undersurface of the substrate W is supported at the position of each of the first burls 220 and the substrate W can be imaged.

The steps of releasing illustrated in FIG. 5, re-engagement which happens between FIGS. 5 and 6, disengagement as illustrated in FIG. 6 and further re-engagement as illustrated in FIG. 7 can be performed as many times as is desired, each iteration resulting in a further reduction in in-plane stresses in the substrate W.

Although described above with reference to increasing and decreasing underpressures, the first and/or second force can be generated in other ways, for example electrostatically for example using Coulomb clamping or Johnson-Rahbek clamping for example by applying a voltage to one or more electrodes. In a further embodiment, the first and/or second force can be generated or at least controlled by a combination of applying an underpressure and electrostatically.

In order for the clamping system 1000 to be able independently to generate pressures in the space between the second main body surface 214 and the support surface 300 and between the first main body surface 212 and the substrate W it is desirable that the passage of gas from a first side of the substrate holder 200 to the second side of the substrate holder 200 through the main body 210 is prevented. Therefore if any through holes are provided through the main body 210 it must be possible for these through holes to be blocked. For example, pins may be provided in the substrate support WT which are actuatable (not depicted in the figures). The pins can be actuated such that they protrude away from the substrate support WT more than the first burls 220. During loading and unloading of the substrate W, the pins are extended and the substrate W is supported by the pins. The pins are then retracted thereby to place the substrate W onto the distal end surfaces of the first burls 220 which have a corresponding second burl 240. A seal must be provided to ensure that it is possible to generate different vacuum pressures of either side of the main body 210.

Passages are provided in order to generate the underpressures. A passage in the substrate support WT with an opening in the support surface 300 is provided to generate the underpressure between the substrate holder 200 and the substrate support WT. In order to generate the underpressure between the substrate holder 200 and the substrate W, one or more passages within the main body 210 with openings in the first main body surface 212 are provided. The opposite ends of those passages are connected to an underpressure source with a hose, for example.

Prior art substrate holders have required the distal end surfaces of all of the first burls to lie substantially in the same plane. Previously it has been only possible to achieve a flatness within specification if each of the first burls 220 has a corresponding second burl 240. This is because the distal end surfaces of the first burls 220 where polished in order to achieve the desired level of flatness. The amount of material removed during polishing depends upon the force between the polishing stone and the first burl 220. In a case of a first burl 220 not having a corresponding second burl 240, the polishing stone would depress the first burl 220 and slightly bend the main body 210 and so remove less material than from those first burls 220 than in the case where they are supported directly underneath by a corresponding second burl 240. However since the introduction of new flattening techniques, such as ion beam milling/polishing, litho etching etc. the variation in stiffness of the main body 210 under the first burl 220 no longer introduces such a defect because the amount of material removed in ion beam milling is not related to the stiffness of the main body 210 under the burls being milled. The introduction of these new flattening techniques has enabled substrate holders 200 such as illustrated in FIG. 4 to be introduced where burls of different subsets of first burls can be manufactured with different heights.

In an embodiment the gap 222 is 3 nm or more, preferably 10 nm or more and more preferably 30 nm or more, desirably 50 nm or more or even 100 nm or more. The gap 222 is chosen according to the stiffness of the main body 210 and the magnitude of the first and second forces, in use, during imagining. For example, the gap is equal to the difference in stiffness of the main body 210 between the burls of the first subset 220*a* and the second subset 220*b* multiplied by the overall force applied to the main body 210 by the first force and second force during imagining of the substrate.

The above description is explained on the basis of the forces between the substrate W, substrate holder 200 and substrate support WT being generated using underpressures. However this need not be the case and the forces may be generated in any other way, including by using electrostatic forces. This will now be described with reference to FIG. 8.

Figure 8:
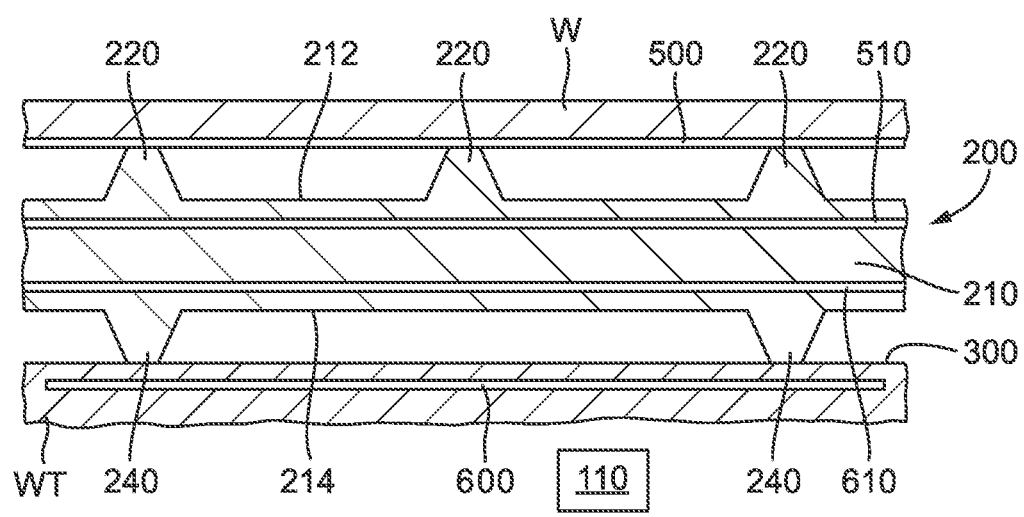
FIG. 8 illustrates, in cross-section, an alternative embodiment of the substrate holder, substrate and substrate support of FIG. 3.

In FIG. 8 electrodes 500, 510, 600, 610 are provided for generating the first and second forces between the substrate W, the substrate holder 200 and the substrate support WT. The magnitude of the forces are dependent upon the voltage applied to the electrodes.

In the embodiment of FIG. 8 one or more substrate electrode(s) 500 is/are deposited on the underside of the substrate W. One or more first substrate holder electrode(s) 510 embedded within the main body 210 of the substrate holder 200 is/are also provided. By providing a potential difference between the substrate electrode(s) 500 and the first substrate holder electrode(s) 510, a force attracting the substrate W towards the substrate holder 200 can be generated. Similarly, one or more substrate support electrode(s) 600 is/are provided in the substrate support WT. One or more second substrate holder electrode(s) 610 is/are provided in the main body 210 of the substrate holder 200. A potential difference between the substrate support electrode(s) 600 and the second substrate holder electrode(s) 610 results in a force between the substrate holder 200 and the substrate support WT. Apart from the way in which the force is generated the clamping system 1000 of FIG. 8 is the same as described above with reference to FIGS. 3-7.

In an embodiment only one or more first substrate holder electrode(s) is/are provided in the substrate holder 200 which is/are at the same potential and is/are used both for generating the force between the substrate W and the substrate holder 200 and between the substrate holder 200 and the substrate support WT.

Figure 9:
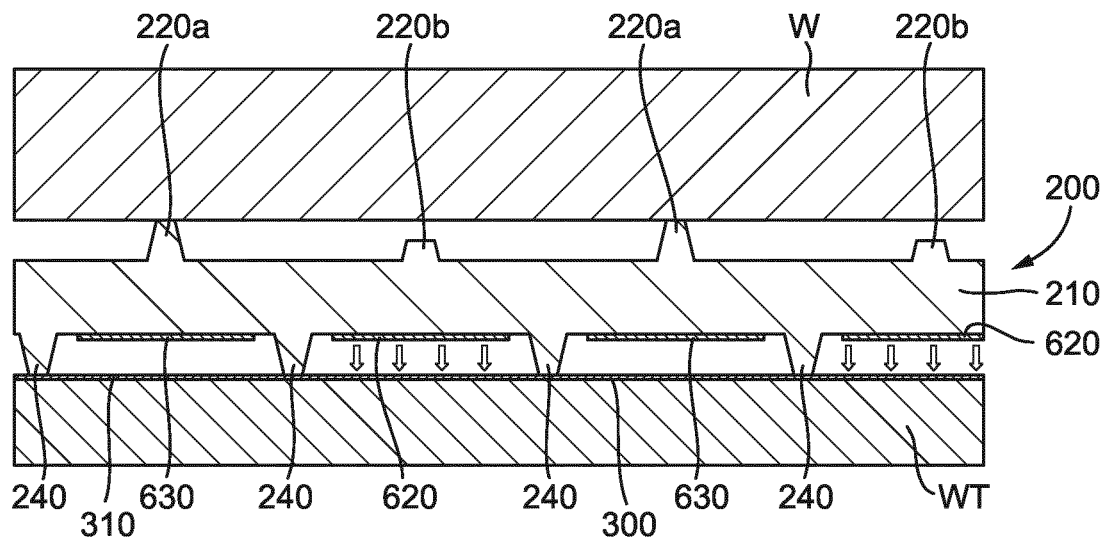
FIGS. 9 and 10 illustrate, in cross-section, an alternative embodiment of the substrate holder, substrate and substrate support of FIG. 3.
Figure 10:
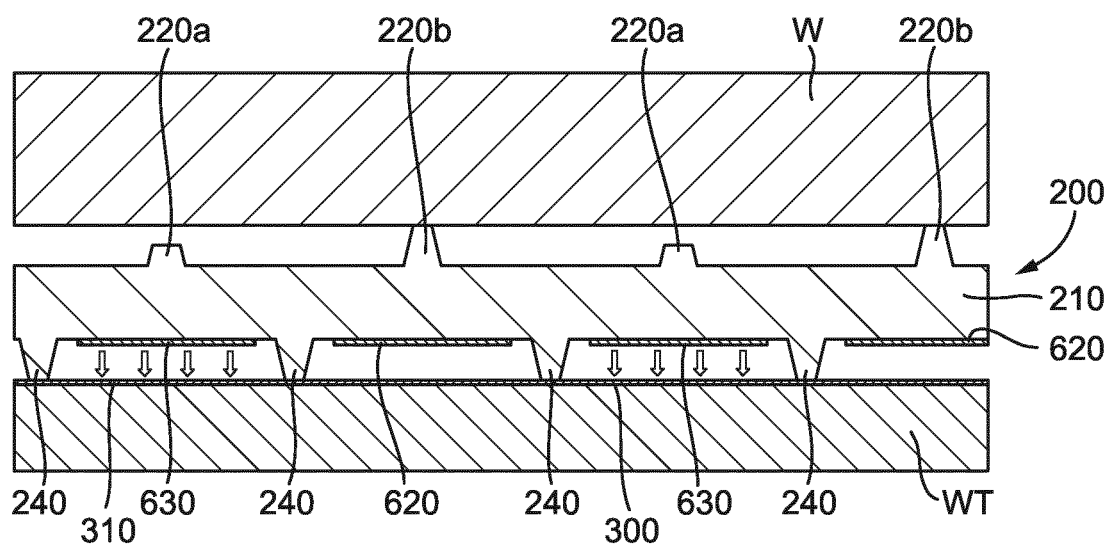

FIGS. 9 and 10 show a further embodiment. In the embodiment of FIGS. 9 and 10 the second force between the substrate holder 200 and substrate W may be generated either electrostatically as illustrated in FIGS. 9 and 10 or using an underpressure as illustrated for example in FIG. 3 or by a different means or by a combination of those two means.

In the embodiment of FIGS. 9 and 10 the stiffness of the main body 210 at positions corresponding to burls of the first subset 220*a* and at positions corresponding to burls of the second subset 220*b* is the same although this is not necessarily the case. However at least two sets of substrate holder electrodes 620, 630 are provided such that the first force at portions of the main body 210 of the substrate holder 200 underneath the first subset 220*a* are controllable independently of the first force at portions of the main body 210 of the substrate holder 200 underneath the second subset 220*b* of the plurality of first burls 220. In the embodiment of FIGS. 9 and 10 this is arranged by ensuring that the relative positions of the first burls 220 and the second burls 240 alternate such that each first burl 220 is positioned, in plan, in a gap between corresponding second burls 240. Thus each of the first burls 220 is at a position at which quite a large deformation of the main body 210 is possible (i.e. the main body 210 is not stiff). By providing first substrate holder electrodes 630 at positions underneath burls of the first subset 220*a* and the second substrate holder electrodes 620 at positions underneath burls of the second subset 220*b*, it is possible independently to control the height of the distal end surfaces of burls of the first subset 220*a* relative to the support surface 300 compared to the height of the distal end surfaces of burls of the second subset 220*b* relative to the support surface 300.

For example, as illustrated in FIG. 9, an electrostatic force is generated between second substrate holder electrodes 620 corresponding to burls of the second subset 220*b* and an electrode 310 of the substrate support WT. As a result of this attractive force, the burls of the second subset 220*b* are retracted away from the substrate W leaving the substrate W supported by the burls of the first subset 220*a*. In this position any in-plane stresses in the burls of the second subset 220*b* can relax.

Conversely, in FIG. 10, electrostatic forces generated between the first substrate holder electrodes 630 and the electrode 310 which is part of the substrate support WT are effective to retract the burls of the first subset 220*a* away from the substrate W. The substrate W is then supported by burls of the second subset 220*b*. Any in-plane stresses in the burls of the first subset 220*a* can relax. This process may be repeated any number of times. In order then to clamp the substrate W for imagining the distal end surfaces of all of the first burls 220 are allowed to contact the undersurface of the substrate W. In this embodiment the distal end surfaces of all of the first burls 220 are substantially coplanar, even when no forces are present on the substrate holder 200.

Figure 11:
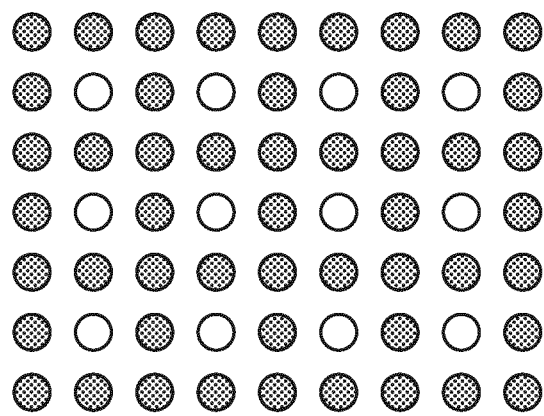
FIG. 11 illustrates schematically a pattern of first and second burls not falling within the scope of the present invention.

FIG. 11 illustrates an embodiment of an arrangement of first burls 220 and second burls 240 according to the invention. In the schematic diagram the solid dots are representative of first burls 220 (of the first subset 220*a*) which have no corresponding second burl 240 (e.g. like the central burl of FIGS. 5-8) whereas circles with no shading are representative of first burls 220 (of the second subset 220*b*) which have corresponding second burls 240 under them (i.e. like on the right and left hand side of the embodiments shown in FIGS. 5-7).

In the FIG. 11 embodiment only one in every four of the first burls 220 has a corresponding second burl 240. The supported area per first burl 220 (i.e. the supporting area of second burls 240) is similar. The rotational symmetry of the first and second pattern (four) is the same for the first pattern and second pattern. This desirably results in substantially symmetrical deformation of the main body 210 around each of the second burls 240.

Embodiments are provided according to the following clauses:

1. A method of clamping a substrate to a clamping system, the method comprising:
providing a substrate holder comprising;
a main body having a first main body surface and a second main body surface, wherein the first main body surface and second main body surface are on opposite sides of the main body; and
a plurality of first burls projecting from the first main body surface, wherein each first burl has a distal end surface configured to support the substrate;
providing a support surface for supporting the substrate holder;
providing a plurality of second burls for supporting the substrate holder on the support surface through contact with distal end surfaces of the plurality of second burls:
generating a first force to attract the substrate holder to the support surface;
placing the substrate on the substrate holder such that it contacts the plurality of first burls;
generating a second force to attract the substrate to the substrate holder; and
controlling at least one of the first force and the second force in a release step to deform the main body between the second burls such as to create a gap between the distal end surfaces of a first subset of the plurality of first burls and the substrate and such that the substrate is supported on distal end surfaces of a second subset of the plurality of first burls.

2. The method of claim 1, wherein the controlling further comprises controlling at least one of the first force and the second force in a re-engagement step to deform the main body such that the distal end surfaces of the first subset of the plurality of first burls contact the substrate.

3. The method of claim 2, wherein the controlling further comprises controlling at least one of the first force and the second force in a disengagement step to deform the main body such as to create a gap between the distal surfaces of the second subset of the plurality of first burls and the substrate.

4. The method of claim 3, wherein the controlling further comprises controlling at least one of the first force and the second force in a further re-engagement step to deform the main body such that the distal surfaces of the second subset of the plurality of first burls contact the substrate.

5. The method of claim 4, wherein the release step, re-engagement step, disengagement step and further re-engagement step are performed in that order multiple times.

6. The method of any of claims 1 to 5, wherein the release step comprises increasing a magnitude of the first force from an initial value and/or reducing a magnitude of the second force from an initial value.

7. The method of any of claims 1 to 6, wherein the first force is at least partly generated by applying an underpressure between the support surface and the substrate holder, and/or wherein the second force is at least partly generated by applying an underpressure between the substrate and the substrate holder, and/or wherein the first force and/or the second force is at least partly generated by applying an electrostatic force via an electrode.

8. The method of claim 7, wherein the main body is configured, in use, to block passage of gas from the first main body surface to the second main body surface through the main body and vice versa.

9. A substrate holder for use in a lithographic apparatus and configured to support a substrate on a substrate support, the substrate holder comprising:
a main body having a first main body surface and a second main body surface, wherein the first main body surface and the second main body surface are on opposite sides of the main body;
a plurality of first burls projecting from the first main body surface, wherein each first burl has a distal end surface configured to support the substrate; and
a plurality of second burls projecting from the second main body surface, wherein each second burl has a distal end surface for supporting the substrate holder on the substrate support,
wherein the distal end surfaces of a first subset of the plurality of first burls are a first distance from the first main body surface and the distal end surfaces of a second subset of the plurality of first burls are a second distance from the first main body surface, the first distance is more than the second distance.

10. A substrate support comprising:
a substrate holder comprising:
a main body having a first main body surface and a second main body surface, wherein the first main body surface and second main body surface are on opposite sides of the main body; and
a plurality of first burls projecting from the first main body surface, wherein each first burl has a distal end surface configured to support the substrate; and
a support surface for supporting the substrate holder through contact with distal end surfaces of a plurality of second burls projecting from the support surface;
wherein the distal end surfaces of a first subset of the plurality of first burls are a first distance from the first main body surface and the distal end surfaces of a second subset of the plurality of first burls are a second distance from the first main body surface, the first distance is more than the second distance.

11. The substrate holder of claim 9 or the substrate support of claim 10, wherein the main body is configured in use, to block passage of gas from the first main body surface to the second main body surface through the main body and vice versa.

12. The substrate holder of claim 9 or 11 or the substrate support of claim 10 or 11, wherein the second subset of the plurality of first burls each has an axis which is closer to an axis of one of the plurality of second burls than an axis of the first subset of the plurality of first burls, and/or wherein there is a greater number of the first burls than the second burls, and/or wherein the number of the second subset of the plurality of first burls is substantially equal to the number of the plurality of second burls.

13. The substrate holder of any of claim 9, 11 or 12 or the substrate support of any of claim 12, 13 or 14, wherein a stiffness of the substrate holder at a position corresponding to positions of each of the second subset of the plurality of first burls is greater than a stiffness of the substrate holder at a position corresponding to positions of each of the first subset of the plurality of first burls.

14. A substrate holder for use in a lithographic apparatus and configured to support a substrate on a substrate support, the substrate holder comprising:

a main body having a first main body surface and a second main body surface, wherein the first main body surface and the second main body surface are on opposite sides of the main body;

a plurality of first burls projecting from the first main body surface, wherein each first burl has a distal end surface configured to support the substrate;

a plurality of electrodes to which voltages may be applied in order to secure the substrate holder to the substrate support; wherein the plurality of electrodes are configured such that depending on the voltage applied, a force between portions of the main body of the substrate holder underneath a first subset of the plurality of first burls and the substrate support is controllable independently of a force between portions of the main body of the substrate holder underneath a second subset of the plurality of first burls and the substrate support.

15. A lithographic apparatus comprising a substrate holder of any of claims 9 and 11 to 14 or the substrate support of any of claims 10 to 13.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A substrate holder for use in a lithographic apparatus and configured to support a substrate on a substrate support, the substrate holder comprising:

a main body having a first main body surface and a second main body surface, wherein the first main body surface and the second main body surface are on opposite sides of the main body;

a plurality of first burls projecting from the first main body surface, wherein each first burl has a distal end surface configured to support the substrate; and a plurality of second burls projecting from the second main body surface, wherein each second burl has a distal end surface for supporting the substrate holder on the substrate support, wherein the distal end surfaces of a first subset of the plurality of first burls are a first distance from the first main body surface and the distal end surfaces of a second subset of the plurality of first burls are a second distance from the first main body surface, the first distance is more than the second distance.

2. The substrate holder of claim 1, wherein the main body is configured in use, to block passage of gas from the first main body surface to the second main body surface through the main body and vice versa.

3. The substrate holder of claim 1, wherein the second subset of the plurality of first burls each has an axis which is closer to an axis of one of the plurality of second burls than an axis of the first subset of the plurality of first burls, and/or wherein there is a greater number of the first burls than the second burls, and/or wherein the number of the second subset of the plurality of first burls is substantially equal to the number of the plurality of second burls.

4. The substrate holder of claim 1, wherein a stiffness of the substrate holder at a position corresponding to positions of each of the second subset of the plurality of first burls is greater than a stiffness of the substrate holder at a position corresponding to positions of each of the first subset of the plurality of first burls.

5. The substrate holder of claim 1, wherein the first distance is 3 nm or more than the second distance.

6. A substrate support comprising:

a substrate holder comprising:

a main body having a first main body surface and a second main body surface, wherein the first main body surface and second main body surface are on opposite sides of the main body; and a plurality of first burls projecting from the first main body surface, wherein each first burl has a distal end surface configured to support the substrate; and a support surface configured to support the substrate holder through contact with distal end surfaces of a plurality of second burls projecting from the support surface, wherein the distal end surfaces of a first subset of the plurality of first burls are a first distance from the first main body surface and the distal end surfaces of a second subset of the plurality of first burls are a second distance from the first main body surface, the first distance is more than the second distance.

7. The substrate support of claim 6, wherein the main body is configured in use, to block passage of gas from the first main body surface to the second main body surface through the main body and vice versa.

8. The substrate support of claim 6, wherein the second subset of the plurality of first burls each has an axis which is closer to an axis of one of the plurality of second burls than an axis of the first subset of the plurality of first burls, and/or wherein there is a greater number of the first burls than the second burls, and/or wherein the number of the second subset of the plurality of first burls is substantially equal to the number of the plurality of second burls.

9. The substrate support of claim 6, wherein a stiffness of the substrate holder at a position corresponding to positions of each of the second subset of the plurality of first burls is greater than a stiffness of the substrate holder at a position corresponding to positions of each of the first subset of the plurality of first burls.

10. The substrate support of claim 6, wherein the first distance is 3 nm or more than the second distance.

11. A substrate holder for use in a lithographic apparatus and configured to support a substrate on a substrate support, the substrate holder comprising:
a main body having a first main body surface and a second main body surface, wherein the first main body surface and the second main body surface are on opposite sides of the main body;
a plurality of first burls projecting from the first main body surface, wherein each first burl has a distal end surface configured to support the substrate;
protruding portions projecting from the second main body surface; and
a plurality of electrodes to which voltages may be applied in order to secure the substrate holder to the substrate support, at least one of the electrodes extending at least partly in a region between the protruding portions,
wherein the plurality of electrodes are configured such that depending on the voltage applied, a force between the substrate support and portions of the main body of the substrate holder underneath a first subset of the plurality of first burls is controllable independently of a force between the substrate support and portions of the main body of the substrate holder underneath a second subset of the plurality of first burls.

12. The substrate holder of claim 11, wherein the main body is configured in use, to block passage of gas from the first main body surface to the second main body surface through the main body and vice versa.

13. The substrate holder of claim 11, wherein a stiffness of the substrate holder at a position corresponding to positions of each of the second subset of the plurality of first burls is greater than a stiffness of the substrate holder at a position corresponding to positions of each of the first subset of the plurality of first burls.

14. A method of clamping a substrate to a clamping system, the method comprising:
generating a first force to attract a substrate holder to a support surface for supporting the substrate holder, wherein the substrate holder comprises a main body having a first main body surface and a second main body surface, wherein the first main body surface and second main body surface are on opposite sides of the main body, and a plurality of first burls project from the first main body surface, wherein each first burl has a distal end surface to support a substrate and wherein a plurality of second burls support the substrate holder on the support surface through contact with distal end surfaces of the plurality of second burls;
placing the substrate on the substrate holder such that it contacts the plurality of first burls;
generating a second force to attract the substrate to the substrate holder; and
controlling the first force and/or the second force in a release step to deform the main body between the second burls such as to create a gap between the distal end surfaces of a first subset of the plurality of first burls and the substrate and such that the substrate is supported on distal end surfaces of a second subset of the plurality of first burls.

15. The method of claim 14, wherein the controlling further comprises controlling the first force and/or the second force in a re-engagement step to deform the main body such that the distal end surfaces of the first subset of the plurality of first burls contact the substrate.

16. The method of claim 15, wherein the controlling further comprises controlling the first force and/or the second force in a disengagement step to deform the main body such as to create a gap between the substrate and the distal surfaces of the second subset of the plurality of first burls.

17. The method of claim 16, wherein the controlling further comprises controlling the first force and/or the second force in a further re-engagement step to deform the main body such that the distal surfaces of the second subset of the plurality of first burls contact the substrate.

18. The method of claim 17, wherein the release step, re-engagement step, disengagement step and further re-engagement step are performed in that order multiple times.

19. The method of claim 14, wherein the release step comprises increasing a magnitude of the first force from an initial value and/or reducing a magnitude of the second force from an initial value.

20. The method of claim 14, wherein the first force is at least partly generated by applying an underpressure between the support surface and the substrate holder, and/or wherein the second force is at least partly generated by applying an underpressure between the substrate and the substrate holder, and/or wherein the first force and/or the second force is at least partly generated by applying an electrostatic force via an electrode.

* * * * *